(12) United States Patent
Li et al.

(10) Patent No.: US 7,986,550 B2
(45) Date of Patent: Jul. 26, 2011

(54) ANALOG ACCESS CIRCUIT FOR VALIDATING CHALCOGENIDE MEMORY CELLS

(75) Inventors: Bin Li, Chantilly, VA (US); Adam Matthew Bumgarner, Duluth, GA (US)

(73) Assignees: BAE Systems Information and Electronics Systems Integration Inc., Nashua, NH (US); Ovonyx, Inc., Rochester Hills, MI (US)

( * ) Notice: Subject to any disclaimer, the term of this patent is extended or adjusted under 35 U.S.C. 154(b) by 88 days.

(21) Appl. No.: 12/525,510

(22) PCT Filed: Nov. 26, 2008

(86) PCT No.: PCT/US2008/084784
§ 371 (c)(1),
(2), (4) Date: Jul. 31, 2009

(87) PCT Pub. No.: WO2009/070635
PCT Pub. Date: Jun. 4, 2009

(65) Prior Publication Data
US 2010/0074000 A1  Mar. 25, 2010

Related U.S. Application Data

(60) Provisional application No. 60/991,428, filed on Nov. 30, 2007.

(51) Int. Cl.
*G11C 7/00* (2006.01)
(52) U.S. Cl. .............. 365/163; 365/189.15; 365/151
(58) Field of Classification Search .......... 365/113, 365/151, 163, 176, 189.15
See application file for complete search history.

(56) References Cited

U.S. PATENT DOCUMENTS

| 6,466,498 | B2* | 10/2002 | Hogan | 365/206 |
| 7,471,552 | B2* | 12/2008 | Parkinson et al. | 365/163 |
| 2005/0030788 | A1 | 2/2005 | Parkinson et al. | |

* cited by examiner

*Primary Examiner* — Gene N. Auduong
(74) *Attorney, Agent, or Firm* — Dillon & Yudell LLP; Anthony Ng; Daniel J. Long

(57) ABSTRACT

An analog access circuit for characterizing chalcogenide memory cells is disclosed. The analog access circuit includes an analog access control module, an address and data control module, and an analog cell access and current monitoring module. The analog access control module selectively controls whether a normal memory access or an analog memory access should be performed on a specific chalcogenide memory cell. The address and data control module allows a normal memory access to the chalcogenide memory cell according to an input address. The analog cell access and current monitoring module performs an analog memory access to the chalcogenide memory cell according to the input address, and monitors a reference current from a sense amplifier associated with the chalcogenide memory cell.

6 Claims, 3 Drawing Sheets

ANALOG ACCESS CIRCUIT FOR VALIDATING CHALCOGENIDE MEMORY CELLS

PRIORITY CLAIM

The present application claims benefit of priority under 35 U.S.C. §365 to the previously filed international patent application number PCT/US2008/084784 filed on Nov. 26, 2008, assigned to the assignee of the present application, and having a priority date of Nov. 30, 2007, based upon U.S. provisional patent application No. 60/991,428 filed Nov. 30, 2007. The contents of both applications are incorporated herein by reference.

STATEMENT OF GOVERNMENT INTEREST

The present invention was made with United States Government assistance under Contract No. FA9453-04-C-0052 awarded by the United States Air Force. The United States Government has certain rights in the present invention.

BACKGROUND OF THE INVENTION

1. Technical Field

The present invention relates to memory devices in general, and in particular to an analog access circuit for validating chalcogenide memory cells.

2. Description of Related Art

Chalcogenide random access memory utilizes a thermally activated, rapid, reversible change in the structure of the chalcogenide alloy for storing data. This type of phase-change memories has been under development for several years at semiconductor manufacturing facilities worldwide. A memory cell made of chalcogenide alloy can be programmed to an amorphous state having a high resistance or a polycrystalline state having a low resistance, which can be referred to as a logical "0" or a logical "1," respectively.

In a chalcogenide memory device, a read failure may come from either a defected chalcogenide memory cell or a defected sense amplifier circuit. It is impossible to differentiate the source of such read failure with digital circuits designed for conventional memory devices.

SUMMARY OF THE INVENTION

In accordance with a preferred embodiment of the present invention, an analog access circuit is utilized to isolate a specific chalcogenide memory cell within a memory array for the purpose of characterizing the chalcogenide memory cell. The analog access circuit includes an analog access control module, an address and data control module, and an analog cell access and current monitoring module. The analog access control module selectively controls whether a normal memory access or an analog memory access should be performed on the chalcogenide memory cell. The address and data control module allows a normal memory access to the chalcogenide memory cell according to an input address. The analog cell access and current monitoring module performs an analog memory access to the chalcogenide memory cell according to the input address, and monitors a reference current from a sense amplifier associated with the chalcogenide memory cell.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
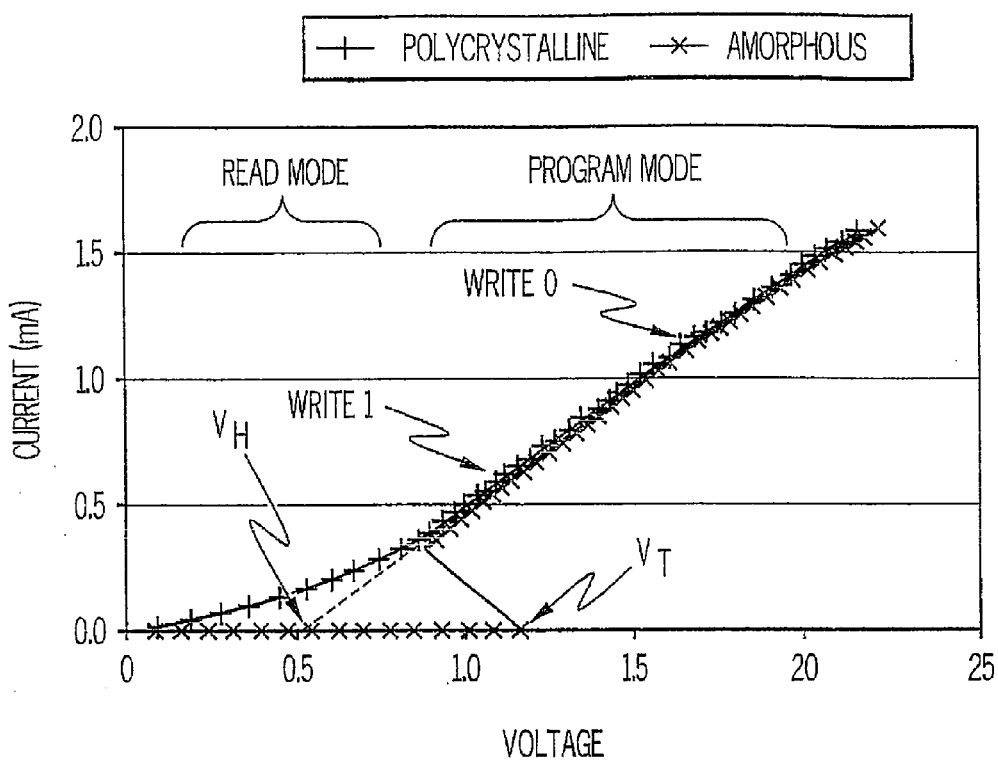
FIG. 1A is a current-voltage curve of a chalcogenide memory cell.

Referring now to the drawings and in particular to FIG. 1A, there is illustrated a current-voltage curve of a chalcogenide memory cell as the chalcogenide memory cell is being programmed and read. As shown, the chalcogenide material in the chalcogenide memory cell behaves like a quasi-linear resistor in a polycrystalline state, and the chalcogenide material exhibits a voltage snap-back at approximately a threshold voltage $V_T$ in an amorphous state.

Figure 1B:
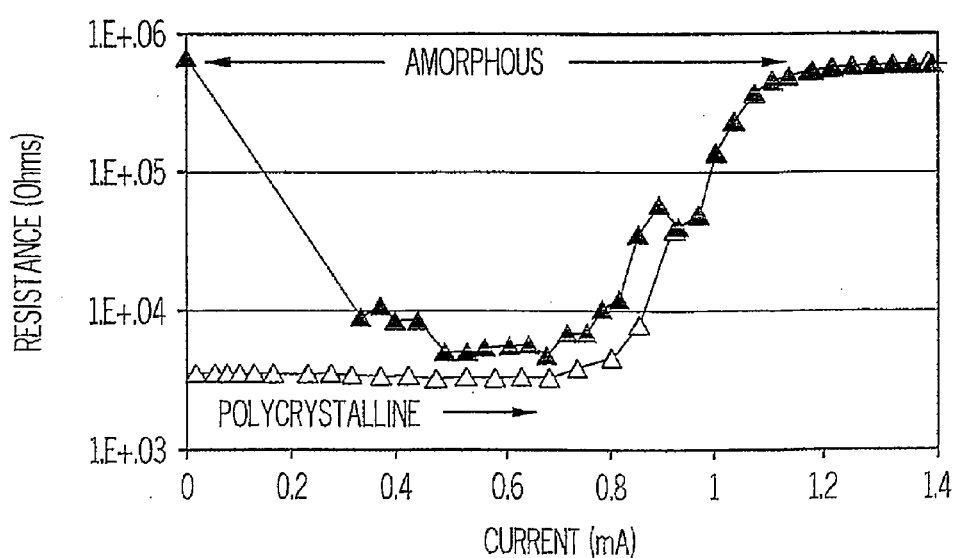
FIG. 1B is a resistance-current curve of a chalcogenide memory cell.

The chalcogenide memory cell can be placed in a read mode when the applied voltage to the chalcogenide material within the chalcogenide memory cell is lower than the threshold voltage $V_T$. Conversely, the chalcogenide memory cell can be placed in a program (or write) mode when the applied voltage to chalcogenide material within the chalcogenide memory cell is higher than the threshold voltage $V_T$. During the program mode, the chalcogenide memory cell can be programmed to either a low-resistance state (i.e., a logical "1" or set) or a high-resistance state (i.e., a logical "0" or reset) by utilizing different write current amplitude to heat the chalcogenide material within the chalcogenide memory cell to either the polycrystalline state or the amorphous state, respectively, as shown in FIG. 1B.

Writing a logical "1" requires a lower current amplitude and a relatively long cooling time. In contrast, writing a logical "0" requires a higher current amplitude and a much shorter cooling time.

An extrapolation of the linear region of the current-voltage curve in FIG. 1A to the x-axis yields a point known as a holding voltage $V_H$. In order to exit the program mode, the applied voltage to the chalcogenide memory cell must be less than the holding voltage $V_H$.

Direct access (read or write) to each chalcogenide memory cell using an analog access circuit is a relatively slow but more accurate tool for validating and characterizing chalcogenide memory cells within a chalcogenide memory device. An analog access circuit can be embedded in each sense amplifier and write head throughout a chalcogenide memory device. The analog access circuit shares the same address decoding logic with the digital circuit such that the resistance of chalcogenide memory cells can be measured in parallel. By stepping through the entire memory address space, the chalcogenide memory cell resistance, write current and read reference current distribution across the chalcogenide memory cells within a chalcogenide memory device can be monitored.

Figure 2:
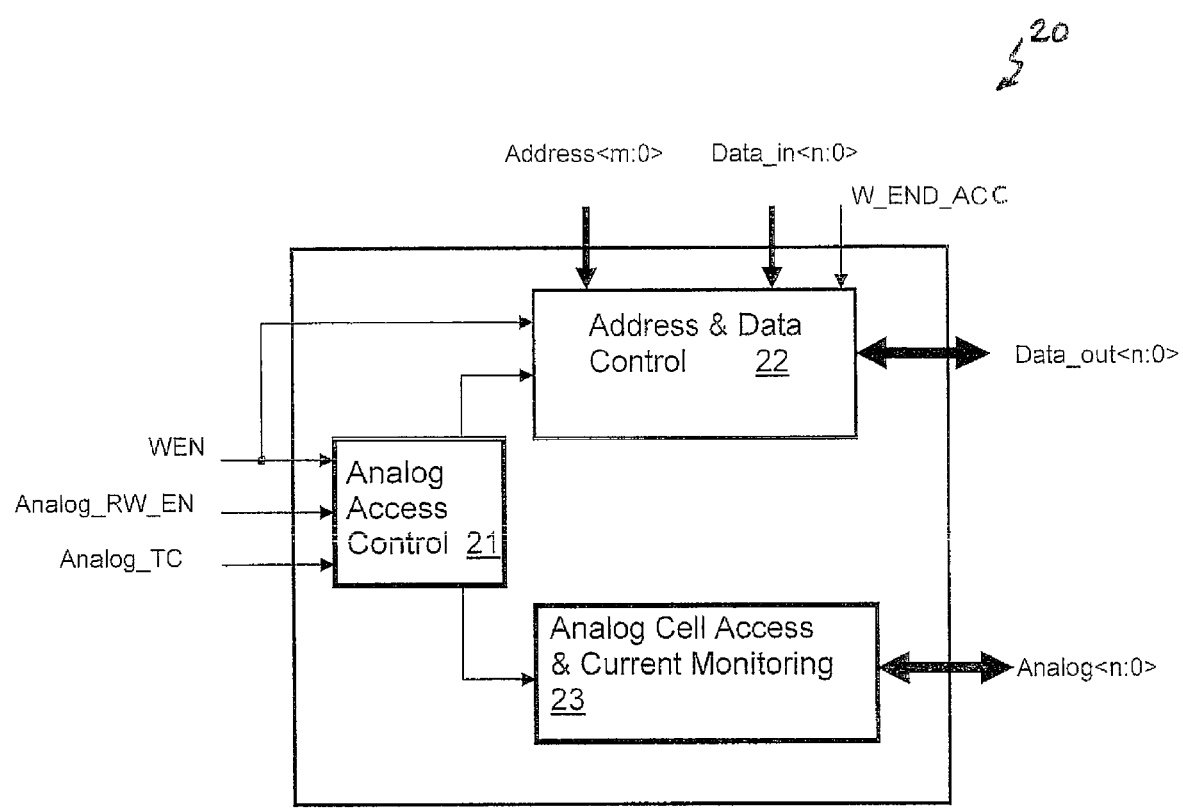
FIG. 2 is a block diagram of an analog access circuit, in accordance with a preferred embodiment of the present invention.

With reference now to FIG. 2, there is depicted a block diagram of an analog access circuit, in accordance with a preferred embodiment of the present invention. As shown, an analog access circuit 20 includes an analog access control module 21, an address and data control module 22, and an analog cell access and current monitoring module 23. Analog access control module 21 controls whether normal (digital) memory access or analog memory access should be performed on each memory cell. The difference between normal memory access and analog memory access is the type of information that can be obtained from a chalcogenide memory cell. A normal memory access yields a current (or voltage) value from a chalcogenide memory cell, which generally corresponds to a logical "1" or a logical "0," as they are related to a specific chalcogenide processing technology. On the other hand, an analog memory access yields a more specific current value from a chalcogenide memory cell, depending of the exact input voltage value to the chalcogenide memory cell. The more specific current value can be converted to a specific cell resistance value intended for the characterization of the chalcogenide memory cell.

Address and data control module 22 allows normal memory access to a specific chalcogenide memory cell according to an input address. Analog cell access and current monitoring module 23 allow analog memory access to a specific chalcogenide memory cell according to an input address and monitors the reference current from a sense amplifier corresponding to the specific chalcogenide memory cell.

Analog access control module 21 includes three inputs, namely, an Analog_RW_EN input, a WEN input and an Analog_TC input. The ability to perform analog reads and/or analog writes to each chalcogenide memory cell can be activated by setting the Analog_RW_EN input and the WEN input to high, and the Analog_TC input to low. When performing an analog read, a voltage that is lower than the chalcogenide threshold voltage $V_T$ is applied through ANALOG<n:0> inputs/outputs of current monitoring module 23. When performing an analog write, a voltage that is higher than the chalcogenide threshold voltage $V_T$ is applied through ANALOG<n:0> inputs/outputs of current monitoring module 23.

The write current in each write head circuit can be monitored by setting the Analog_RW_EN input of analog access control module 21 and a W_END_ACC input of data control module 22 to high, and the WEN input of analog access control module 21 and Data_in<n:0> inputs of data control module 22 to low. Similarly, the sense amplifier reference current can be monitored by setting the Analog_RW_EN input, the WEN input and the Analog_TC input of analog access control module 21 to high. A certain amount of voltage will be forced through the ANALOG<n:0> inputs/outputs of current monitoring module 23, and the reference current can be measured through the ANALOG<n:0> inputs/outputs of current monitoring module 23.

Figure 3:
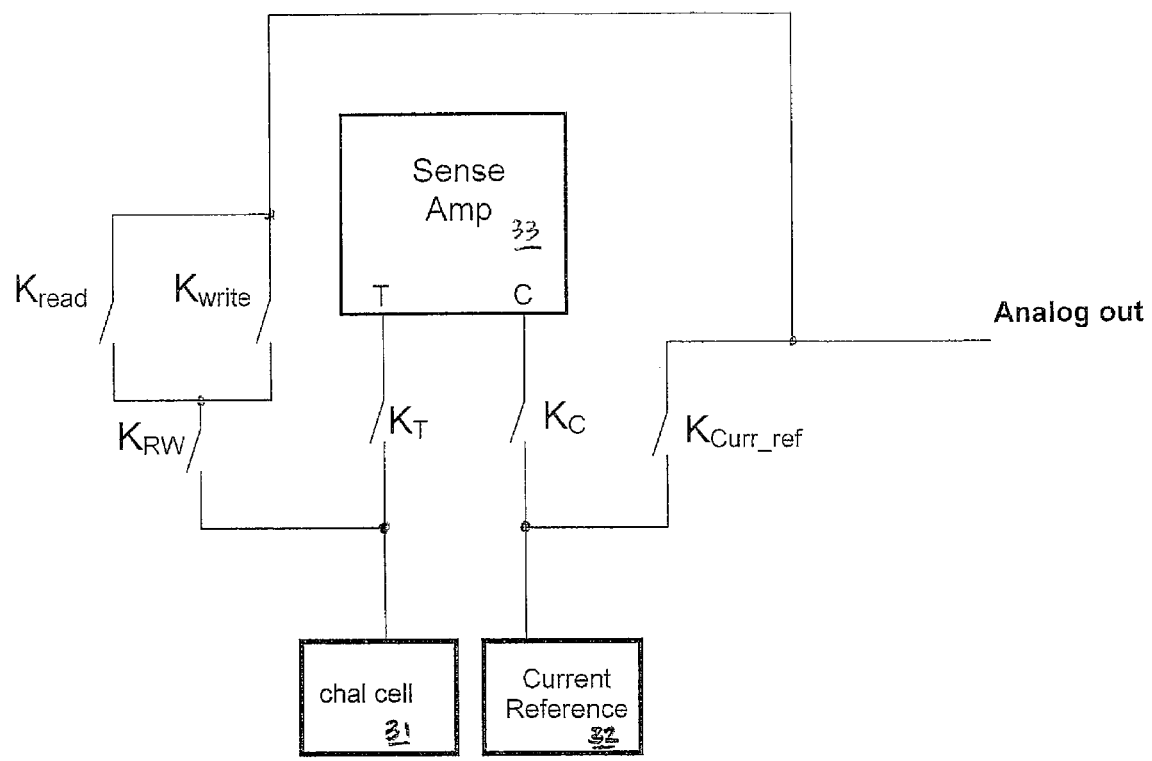
FIG. 3 is a block diagram of an analog access in a chalcogenide memory cell, in accordance with a preferred embodiment of the present invention.

Referring now to FIG. 3, there is illustrated a block diagram of an analog access in a chalcogenide memory cell, in accordance with a preferred embodiment of the present invention. During an analog read mode, all internal current paths into a chalcogenide memory cell 31 are shut off by opening switches $K_{write}$, $K_T$, $K_C$ and $K_{curr\_ref}$, which allows an accurate measurement of the current flowing through chalcogenide memory cell 31 after a small external voltage (not shown) is applied to chalcogenide memory cell 31. The external voltage is preferably in the range of a few hundred millivolts. All switches except $K_{curr\_ref}$ are open during the measurement of the resistance of chalcogenide memory cell 31.

During an analog write mode, only switches $K_{write}$ and $K_{RW}$ are closed. After a write operation has been performed to chalcogenide memory cell 31, analog access circuit 20 (from FIG. 2) monitors the reference current from a corresponding sense amplifier 33 along with a current reference module 32 to generates an exact cell resistance of chalcogenide memory cell 31.

As has been described, the present invention provides an analog access circuit for validating and characterizing chalcogenide memory cells within a chalcogenide memory device.

While the invention has been particularly shown and described with reference to a preferred embodiment, it will be understood by those skilled in the art that various changes in form and detail may be made therein without departing from the spirit and scope of the invention.

What is claimed is:

1. An analog access circuit for validating and characterizing chalcogenide memory cells, said analog access circuit comprising:
    an analog access control module for selectively controlling whether a normal memory access or an analog memory access should be performed on a chalcogenide memory cell capable of storing information in either a first logical state or a second logical state only;
    an address and data control module for allowing said normal memory access to said chalcogenide memory cell according to an input address; and
    an analog cell access and current monitoring module for performing said analog memory access to said chalcogenide memory cell according to said input address and for monitoring a reference current from a sense amplifier associated with said chalcogenide memory cell, wherein said reference current is generated in response to a specific voltage applied to said chalcogenide memory cell.

2. The analog access circuit of claim 1, wherein said reference current is converted to a cell resistance value for validating the integrity of said chalcogenide memory cell.

3. The analog access circuit of Claim 2, wherein said specific voltage applied to said chalcogenide memory cell is in the range of a few hundred millivolts.

4. The analog access circuit of claim 1, wherein said first logical state represents a logical "1" state, and said second logical state represents a logical "0" state.

5. The analog access circuit of claim 1, wherein said normal memory access on said chalcogenide memory cell yields a current or voltage value that represents either said first logical state or said second logical state.

6. The analog access circuit of claim 1, wherein said analog memory access on said chalcogenide memory cell yields a specific current value that depends on a value of an input voltage to said chalcogenide memory cell.

* * * * *